(12) United States Patent
Fan

(10) Patent No.: US 9,549,099 B2
(45) Date of Patent: Jan. 17, 2017

(54) HYBRID IMAGE SENSOR

(71) Applicant: Apple Inc., Cupertino, CA (US)

(72) Inventor: Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/797,851

(22) Filed: Mar. 12, 2013

(65) Prior Publication Data

US 2014/0267855 A1 Sep. 18, 2014

(51) Int. Cl.
| | |
|---|---|
| *H04N 3/14* | (2006.01) |
| *H01L 27/148* | (2006.01) |
| *H04N 5/378* | (2011.01) |
| *H04N 5/335* | (2011.01) |
| *H01L 27/146* | (2006.01) |
| *H04N 5/3745* | (2011.01) |
| *H04N 5/357* | (2011.01) |

(52) U.S. Cl.
CPC ........ *H04N 3/155* (2013.01); *H01L 27/14609* (2013.01); *H01L 27/14806* (2013.01); *H04N 5/335* (2013.01); *H04N 5/3575* (2013.01); *H04N 5/378* (2013.01); *H04N 5/37452* (2013.01)

(58) Field of Classification Search
CPC ......... H04N 5/335; H04N 3/155; H04N 5/378
USPC ....... 348/294, 296, 301, 302, 308, 309, 310; 250/208.1; 257/40; 341/155
See application file for complete search history.

(56) References Cited

U.S. PATENT DOCUMENTS

| | | | |
|---|---|---|---|
| 4,686,648 A * | 8/1987 | Fossum | 257/235 |
| 5,105,264 A | 4/1992 | Erhardt et al. | |
| 5,329,313 A | 7/1994 | Keith | |
| 5,396,893 A | 3/1995 | Oberg et al. | |
| 5,471,515 A | 11/1995 | Fossum et al. | |
| 5,541,402 A * | 7/1996 | Ackland | H04N 3/155 250/208.1 |
| 5,550,677 A | 8/1996 | Schofield et al. | |
| 5,781,312 A | 7/1998 | Noda | |

(Continued)

FOREIGN PATENT DOCUMENTS

| | | |
|---|---|---|
| CN | 1842138 | 10/2006 |
| CN | 101189885 | 5/2008 |

(Continued)

OTHER PUBLICATIONS

Aoki et al., "Rolling-Shutter Distortion-Free 3D Stacked Image Sensor with −160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.

(Continued)

*Primary Examiner* — Lin Ye
*Assistant Examiner* — Chriss Yoder, III
(74) *Attorney, Agent, or Firm* — Brownstein Hyatt Farber Schreck, LLP

(57) ABSTRACT

A method for performing correlated double sampling for a sensor, such as an image sensor. The method includes collecting a first charge corresponding to a first parameter, transferring the first charge to a first storage component, transferring the first charge from the first storage component to a second storage component, resetting the first storage component, transferring the first charge from the second storage component to the first storage component, and reading the first storage component to determine the first charge. The method may be implemented in electronic devices including image sensors.

9 Claims, 10 Drawing Sheets

(56) References Cited

U.S. PATENT DOCUMENTS

| | | |
|---|---|---|
| 5,841,126 A | 11/1998 | Fossum et al. |
| 5,880,459 A | 3/1999 | Pryor et al. |
| 5,949,483 A | 9/1999 | Fossum et al. |
| 6,008,486 A | 12/1999 | Stam et al. |
| 6,040,568 A | 3/2000 | Caulfield et al. |
| 6,233,013 B1 | 5/2001 | Hosier et al. |
| 6,348,929 B1 | 2/2002 | Acharya et al. |
| 6,448,550 B1 | 9/2002 | Nishimura |
| 6,541,751 B1 | 4/2003 | Bidermann |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,982,759 B2 | 1/2006 | Goto |
| 7,091,466 B2 | 8/2006 | Bock |
| 7,133,073 B1 | 11/2006 | Neter |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,332,786 B2 | 2/2008 | Altice |
| 7,390,687 B2 | 6/2008 | Boettiger |
| 7,437,013 B2 | 10/2008 | Anderson |
| 7,443,421 B2 | 10/2008 | Stavely et al. |
| 7,446,812 B2 | 11/2008 | Ando et al. |
| 7,502,054 B2 | 3/2009 | Kalapathy |
| 7,525,168 B2 | 4/2009 | Hsieh |
| 7,554,067 B2 | 6/2009 | Zarnowski et al. |
| 7,555,158 B2 | 6/2009 | Park et al. |
| 7,626,626 B2 | 12/2009 | Panicacci |
| 7,671,435 B2 * | 3/2010 | Ahn ................ 257/444 |
| 7,728,351 B2 | 6/2010 | Shim |
| 7,733,402 B2 | 6/2010 | Egawa et al. |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,873,236 B2 | 1/2011 | Li et al. |
| 7,880,785 B2 | 2/2011 | Gallagher |
| 7,884,402 B2 * | 2/2011 | Ki ................ 257/292 |
| 7,906,826 B2 | 3/2011 | Martin et al. |
| 7,952,121 B2 | 5/2011 | Arimoto |
| 7,952,635 B2 * | 5/2011 | Lauxtermann ............ 348/308 |
| 8,026,966 B2 | 9/2011 | Altice |
| 8,032,206 B1 | 10/2011 | Farazi et al. |
| 8,089,524 B2 | 1/2012 | Urisaka |
| 8,094,232 B2 | 1/2012 | Kusaka |
| 8,116,540 B2 | 2/2012 | Dean |
| 8,140,143 B2 | 3/2012 | Picard et al. |
| 8,159,570 B2 | 4/2012 | Negishi |
| 8,159,588 B2 | 4/2012 | Boemler |
| 8,164,669 B2 | 4/2012 | Compton et al. |
| 8,184,188 B2 * | 5/2012 | Yaghmai ............ H04N 5/35581 348/294 |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson |
| 8,259,228 B2 | 9/2012 | Wei et al. |
| 8,310,577 B1 | 11/2012 | Neter |
| 8,324,553 B2 | 12/2012 | Lee |
| 8,340,407 B2 | 12/2012 | Kalman |
| 8,350,940 B2 | 1/2013 | Smith et al. |
| 8,400,546 B2 | 3/2013 | Itano et al. |
| 8,456,559 B2 | 6/2013 | Yamashita |
| 8,508,637 B2 | 8/2013 | Han et al. |
| 8,520,913 B2 | 8/2013 | Dean |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogura |
| 8,629,484 B2 | 1/2014 | Ohri et al. |
| 8,634,002 B2 | 1/2014 | Kita |
| 8,648,947 B2 | 2/2014 | Sato et al. |
| 8,723,975 B2 | 5/2014 | Solhusvik |
| 8,754,983 B2 | 6/2014 | Sutton |
| 8,755,854 B2 | 6/2014 | Addison et al. |
| 8,759,736 B2 | 6/2014 | Yoo |
| 8,803,990 B2 | 8/2014 | Smith |
| 8,817,154 B2 | 8/2014 | Manabe et al. |
| 8,902,330 B2 | 12/2014 | Theuwissen |
| 8,908,073 B2 | 12/2014 | Minagawa |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,982,237 B2 | 3/2015 | Chen |
| 9,054,009 B2 | 6/2015 | Oike et al. |
| 9,066,017 B2 | 6/2015 | Geiss |
| 9,066,660 B2 | 6/2015 | Watson et al. |
| 9,088,727 B2 | 7/2015 | Trumbo |
| 9,099,604 B2 | 8/2015 | Roy |
| 9,100,597 B2 | 8/2015 | Hu |
| 9,131,171 B2 | 9/2015 | Aoki et al. |
| 9,270,906 B2 | 2/2016 | Peng et al. |
| 9,344,649 B2 | 5/2016 | Bock |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0200454 A1 * | 8/2009 | Barbier et al. ............ 250/214.1 |
| 2009/0201400 A1 | 8/2009 | Zhang et al. |
| 2010/0019130 A1 * | 1/2010 | Lee ................ H01L 27/14634 250/208.1 |
| 2010/0134631 A1 | 6/2010 | Voth |
| 2010/0208096 A1 * | 8/2010 | Takeda ................ H04N 5/2353 348/222.1 |
| 2010/0276572 A1 * | 11/2010 | Iwabuchi et al. ............ 250/208.1 |
| 2011/0028802 A1 | 2/2011 | Addison et al. |
| 2011/0080500 A1 | 4/2011 | Wang et al. |
| 2011/0156197 A1 | 6/2011 | Tivarus et al. |
| 2011/0157445 A1 * | 6/2011 | Itonaga ............ H01L 21/76898 348/308 |
| 2011/0205415 A1 | 8/2011 | Makino et al. |
| 2011/0245690 A1 | 10/2011 | Watson et al. |
| 2012/0092541 A1 | 4/2012 | Tuulos et al. |
| 2012/0098964 A1 | 4/2012 | Oggier et al. |
| 2012/0147207 A1 | 6/2012 | Itonaga |
| 2012/0153125 A1 | 6/2012 | Oike et al. |
| 2013/0147981 A1 | 6/2013 | Wu |
| 2013/0155271 A1 | 6/2013 | Ishii |
| 2014/0004644 A1 | 1/2014 | Roy |
| 2014/0049683 A1 | 2/2014 | Guenter |
| 2014/0071321 A1 | 3/2014 | Seyama |
| 2014/0240550 A1 | 8/2014 | Taniguchi |
| 2014/0246568 A1 | 9/2014 | Wan |
| 2014/0247378 A1 | 9/2014 | Sharma et al. |
| 2014/0252201 A1 | 9/2014 | Li et al. |
| 2014/0253754 A1 | 9/2014 | Papiashvili |
| 2014/0253768 A1 | 9/2014 | Li |
| 2014/0267855 A1 | 9/2014 | Fan |
| 2014/0347533 A1 | 11/2014 | Toyoda |
| 2014/0354861 A1 | 12/2014 | Pang |
| 2015/0163392 A1 | 6/2015 | Malone et al. |
| 2015/0163422 A1 | 6/2015 | Fan et al. |
| 2015/0237314 A1 | 8/2015 | Hasegawa |
| 2015/0264241 A1 | 9/2015 | Kleekajai et al. |
| 2015/0264278 A1 | 9/2015 | Kleekajai et al. |
| 2015/0312479 A1 | 10/2015 | McMahon et al. |
| 2015/0350575 A1 | 12/2015 | Agranov et al. |
| 2016/0050379 A1 | 2/2016 | Jiang et al. |

FOREIGN PATENT DOCUMENTS

| | | |
|---|---|---|
| CN | 101233763 | 7/2008 |
| CN | 101472059 | 7/2009 |
| CN | 101567977 | 10/2009 |

(56) References Cited

FOREIGN PATENT DOCUMENTS

| | | |
|---|---|---|
| CN | 101622859 | 1/2010 |
| CN | 101803925 | 8/2010 |
| CN | 102036020 | 4/2011 |
| CN | 102821255 | 12/2012 |
| CN | 103329513 | 9/2013 |
| CN | 103546702 | 1/2014 |
| EP | 2023611 | 2/2009 |
| EP | 2107610 | 10/2009 |
| EP | 2230690 | 9/2010 |
| JP | 201149697 | 3/2011 |
| JP | 2012019516 | 1/2012 |
| JP | 2012513160 | 6/2012 |
| KR | 20030034424 | 5/2003 |
| KR | 20030061157 | 7/2003 |
| KR | 2008/0069851 | 7/2008 |
| KR | 20100008239 | 1/2010 |
| KR | 20100065084 | 6/2010 |
| KR | 20130074459 | 7/2013 |
| TW | 201301881 | 1/2013 |
| WO | WO 2010/120945 | 10/2010 |
| WO | WO 2012/053363 | 4/2012 |
| WO | WO 2012/088338 | 6/2012 |
| WO | WO 2012/122572 | 9/2012 |
| WO | WO 2013/008425 | 1/2013 |
| WO | WO 2013/179018 | 12/2013 |
| WO | WO 2013/179020 | 12/2013 |

OTHER PUBLICATIONS

Feng, et al., "On the Stoney Formula for a Thin Film/Substrate System with Nonuniform Substrate Thickness," Journal of Applied Mechanics, Transactions of the ASME, vol. 74, Nov. 2007, pp. 1276-1281.
U.S. Appl. No. 14/481,806, filed Sep. 9, 2014, Kleekajai et al.
U.S. Appl. No. 14/481,820, filed Sep. 9, 2014, Lin et al.
U.S. Appl. No. 14/501,429, filed Sep. 30, 2014, Malone et al.
U.S. Appl. No. 14/503,322, filed Sep. 30, 2014, Molgaard.
U.S. Appl. No. 14/569,346, filed Dec. 12, 2014, Kestelli et al.
U.S. Appl. No. 14/611,917, filed Feb. 2, 2015, Lee et al.
Office Action dated Nov. 27, 2015, TW 103105514, 12 pages.
Elgendi, "On the Analysis of Fingertip Photoplethysmogram Signals," *Current Cardiology Reviews*, 2012, vol. 8, pp. 14-25.
Fu, et al., "Heart Rate Extraction from Photoplethysmogram Waveform Using Wavelet Multui-resolution Analysis," *Journal of Medical and Biological Engineering*, 2008, vol. 28, No. 4, pp. 229-232.
Han, et al., "Artifacts in wearable photoplethysmographs during daily life motions and their reduction with least mean square based active noise cancellation method," *Computers in Biology and Medicine*, 2012, vol. 42, pp. 387-393.
Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.
Santos, et al., "Accelerometer-assisted PPG Measurement During Physical Exercise Using the LAVIMO Sensor System," *Acta Polytechnica*, 2012, vol. 52, No. 5, pp. 80-85.
Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.
Schwarzer, et al., On the determination of film stress from substrate bending: Stoney's formula and its limits, Jan. 2006, 19 pages.
Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.
U.S. Appl. No. 15/056,752, filed Feb. 29, 2016, Wan.

\* cited by examiner

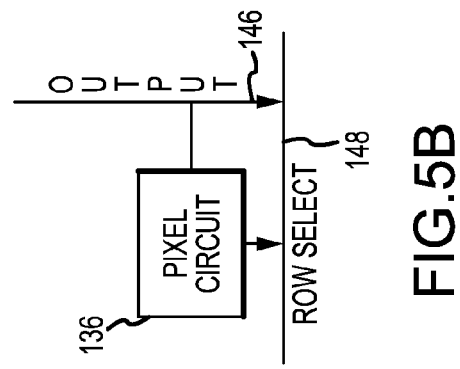
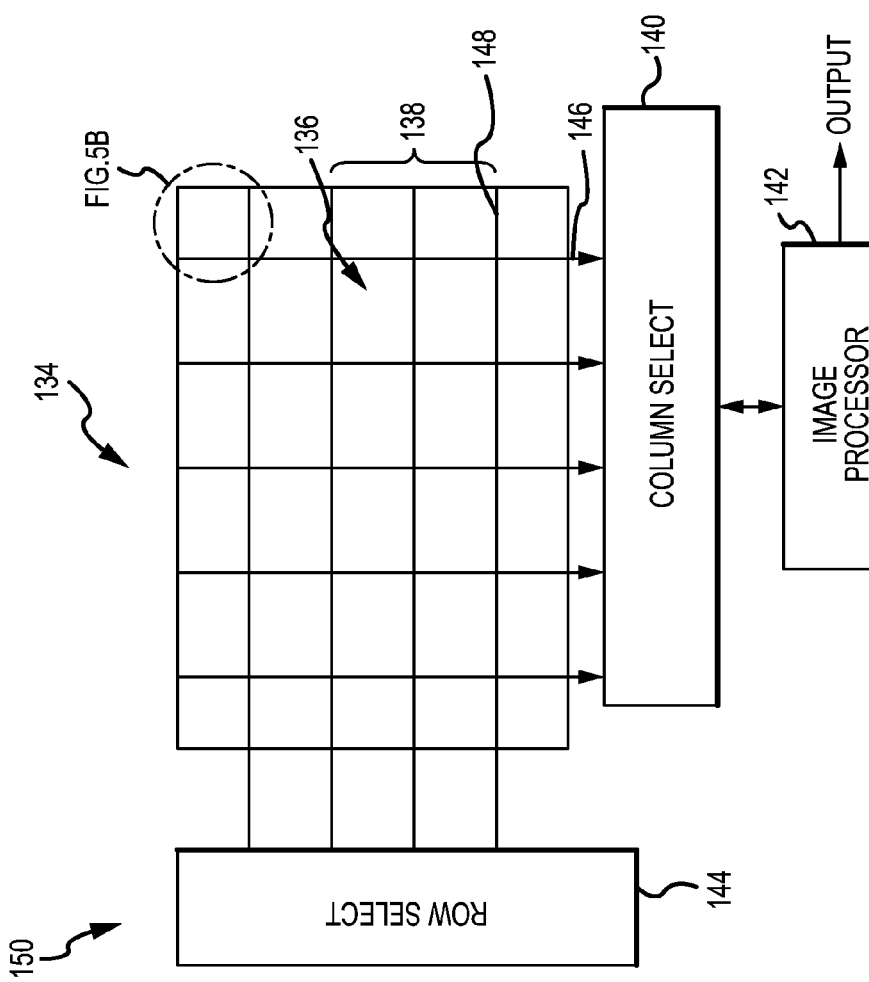

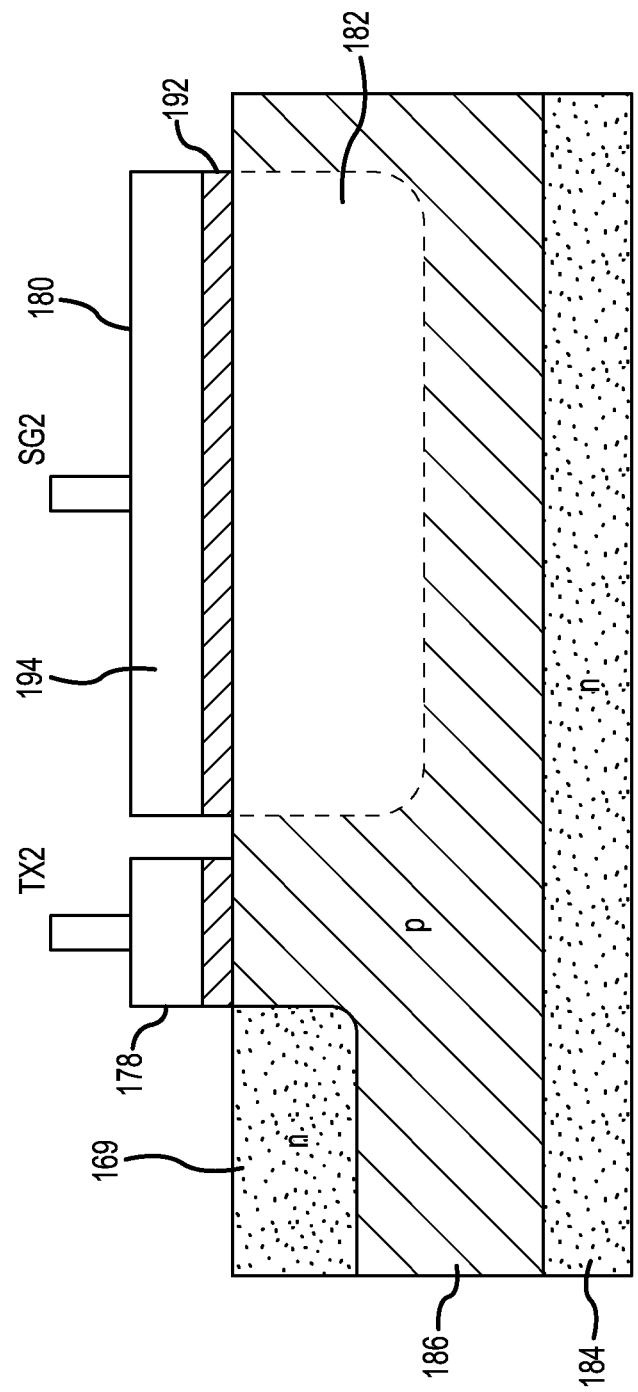

HYBRID IMAGE SENSOR

TECHNICAL FIELD

The present invention relates generally to electronic devices, and more specifically, to image sensors for electronic devices.

BACKGROUND

Cameras and other image recording devices often use one or more image sensors, such as a charged-coupled device (CCD) sensor or a complementary metal-oxide-semiconductor (CMOS) image sensor. A typical CMOS image sensor may include a two-dimensional array of pixels, where each pixel may include a photo detector, such as a photodiode, and one or more transistors to activate each pixel. An image sensor may be implemented in a rolling shutter configuration or a global shutter configuration.

In a rolling shutter, each of the pixels within the image sensor capture light row by row, and the captured light is then read out to a processor row by row. In this configuration, there may be a time delay between when the first pixel row captures light from the scene and when the last pixel row captures light from the scene. Accordingly, if there is movement in the scene between the first and last pixel rows, the movement may be captured as blurred lines or other motion artifacts. In a global shutter, each of the pixels capture light at the same time (i.e., have the same integration period) and then the pixels transfer the light to a storage component until the pixels can be read out by a processor. In a global shutter configuration, motion is captured and reproduced in an image that has less blurring than a rolling shutter, as each of the pixels capture light at the exact same time. However, in this configuration, the image sensor generally must include storage space for each pixel, which may require a reduction in resolution or an increase in size for the image sensor.

In some instances, the light signals corresponding to the images may include noise (e.g., due to residual charge left in the photodiode or photogate). To reduce noise, correlated double sampling may be used that resets a floating diffusion (or other storage node) after an initial read out and then reads the node a second time. However, for multiple images (such as a video or long exposure time), the photodiode or photogate may be reset multiple times during the length of exposure. In these instances, the captured signals readout between resets may be averaged together digitally, but this may introduce additional noise into the system.

SUMMARY

Examples of the disclosure may include a method for performing non-destructive correlated double sampling for a sensor, such as an image sensor. The method includes collecting a first charge corresponding to a first parameter, transferring the first charge to a first storage component, transferring the first charge from the first storage component to a second storage component, resetting the first storage component, transferring the first charge from the second storage component to the first storage component, and reading the first storage component to determine the first charge or its combination with a second charge. The method may be implemented in image sensors for electronic devices, such as smart phones, cameras, and the like.

Other examples of the disclosure may include an image sensor for an electronic device. The image sensor includes a light sensitive element configured to produce a charge corresponding to a light parameter, a transfer gate in communication with the light sensitive element, a floating diffusion node in communication with the light sensitive element, a storage gate in communication with the floating diffusion node, the storage gate having a variable potential, a reset gate in communication with the light sensitive element, a source follower gate in communication with the storage gate, and a row select gate in communication with the source follower gate and the storage gate. The image sensor also includes a logic chip operably connected to the transistor array chip and in communication therewith. During operation, the transfer gate communicates data from the light sensitive element to the floating diffusion node and the logic chip selectively activates the transfer gate, the reset gate, the source follower gate, the row select gate, and the storage gate.

Yet other examples of the disclosure include an electronic device. The electronic device includes a display, a processor in communication with the display, and a camera in communication with the processor. The camera includes a lens, an image sensor in optical communication with the lens, and an image processor in communication with the image sensor and the processor. The image sensor includes a plurality of pixels, where each pixel includes a photodiode configured to detect light transmitted from the lens and create a light value corresponding to the light detected, a first transfer gate in communication with the photodiode, a floating diffusion node in communication with the first transfer gate, a second transfer gate in communication with the floating diffusion node, and a two-way storage component in communication with the floating diffusion node through the second transfer gate. The first transfer gate transfers the light value from the photodiode to the floating diffusion node and the second gate transfers the light value from the floating diffusion node to the second transfer gate and from the second transfer gate to the floating diffusion node.

BRIEF DESCRIPTION OF THE DRAWINGS

FIG. 5A is a simplified schematic of an architecture for the image sensor.

FIG. 5B is an enlarged view of a pixel of the pixel architecture of FIG. 5A.

FIG. 6B is a partially cross-section similar to FIG. 6A with the second storage gate being in the on state.

SPECIFICATION

Overview

Figure 1A:
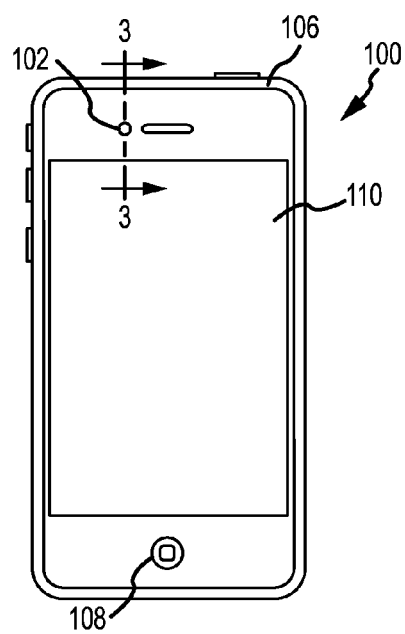
FIG. 1A is a front perspective view of an electronic device including one or more cameras.

The disclosure may take the form of an image sensor for cameras and other electronic devices. The image sensor includes both CMOS and CCD components. As used herein, CMOS components are meant to encompass electrical components, such as gates or transistors and storage components or nodes, where the electric potential is defined, at least in part, by a doping level of a dopant or an impurity value within a silicon substrate. Additionally, CCD components are meant to encompass electrical components, such as gates and/or storage components, where the electric potential is variable or otherwise controlled by a voltage potential applied to an electrode or other gate component in communication with the storage component or gate. In other words, the description of CMOS components is meant to encompass components where the potential may be somewhat fixed (at least due to the doping characteristics of the silicon) and the description of CCD components is meant to encompass those components where the potential can be varied.

The image sensor may include nodes having a potential determined by a doping level within a silicon substrate, whereas other nodes may have a potential determined by an applied voltage. The varying nodes provides a combination of features, allowing the benefits of both CMOS and CCD structures to be implemented within the image sensor. For example, the hybrid structure allows charge to be transferred between different chips of the image sensor (such as a photodiode chip, logic chip, and storage node chip), as well as reduce the noise introduced during correlated double sampling. In particular, the hybrid image sensor may transfer charge to and from a storage node during reset times for correlated double sampling, proving for non-destructive correlated double sampling. In other words, the charge from the photodiode or photogate may be sampled, but without resetting the charge currently collected. This non-destructive correlated double sampling may provide for images captured by the image sensor to have a reduced noise level and other artifacts that can be introduced into an image due to destructive correlated sampling.

In some embodiments, the components of the hybrid images are split between different chips within the image sensor. The split nature of the image sensor allows the use of a CCD structure (which generally requires a specialized manufacturing process) to be combined with CMOS components. Typically, CCD and CMOS structures and operation are not complementary to each other and so the two structures are not used together. However, with the hybrid image sensor, different functions of the image sensor are separated into specialized chips, e.g., photodiode chip, storage node chip, and logic chip, and so each chip may include its own structure and operation. This allows the image sensor to incorporate the hybrid structure including both CMOS and CCD functionality and components.

In one example, the hybrid image sensor may include a storage node positioned between a readout node of a pixel (such as a floating diffusion node) and one or more read out gates. The storage node may be formed of a CCD component and may have a variable potential. Due to the variable potential, the storage node may provide for charge transfer in two ways. For example, after a first integration time for a light collection element, charge may be transferred to the floating diffusion and then to the storage node. The storage node may hold the charge while the floating diffusion is reset and may then transfer the original charge back into the floating diffusion. This may be done by reducing the potential of the storage node, such as by reducing a controlling voltage, so that the floating diffusion node may have a higher potential, pulling the charge back to that node. In this example, the read out node (floating diffusion node) may be sampled twice, but because the storage node kept the original charge and then transferred that charge back to the floating diffusion, the sampling may be done without destroying the initial charge value, that is, the sampling may be non-destructive.

In addition to the components of the image sensor being separated, the functionality of the image sensor may be separated as well. For example, the photodiode chip may be responsible for the light collecting function, the storage node chip may be responsible for storing the light charge prior to readout, and the logic chip may include the readout and processing features. In this embodiment, the improved storage performance provided by the CCD components can be combined with the on-chip image processing functions of CMOS components, which may allow the image sensor to have improved images, without sacrificing processing speed.

In some embodiments, the hybrid image sensor may include a pixel array having two or more chips stacked together and interconnected with a vertical gate structure. In other words, the pixel array may be split into two chips, e.g., one chip having the photodiodes and another chip having the readout circuitry and transistor array. For example, a first chip may first include the photodiode and a second chip, which may be vertically stacked on the first chip, may include the transistor array. A vertical transfer gate may communicatively couple the two chips together. By including the transistor array on a separate chip, the photodiode exposure area may be maximized, as the first chip may not have to include space for the transistor array. This saved space may be used for additional pixels or to increase the well size of each photodiode.

In some embodiments, the image sensor may further include a third chip, such as a logic chip, stacked on top of the transistor array chip. The transistor array chip, photodiode chip, and the logic chip may be in communication through one or more vertical transfer gates, metal to metal (or other conductive material) contacts, and/or through silicon vias. In some instances, two chips, such as the transistor array chip and the logic chip, may be in communication through one communication connection (e.g., through silicon via) and the third chip (e.g., the photodiode chip) may be in communication with one of the other two chips through another connection (e.g., vertical transfer gate). Additionally, in some embodiments, the image sensor may include a fourth chip stacked on the logic chip. For example, the image sensor may include a memory chip stacked on the logic chip.

In other embodiments, the CCD components may be used for light collection and the data may then be transferred to a transistor array chip that may process the data. This hybrid image sensor may provide for enhanced photon collection, while allowing faster processing that can be done on-chip. Conventional CCD image sensors typically do not include on-chip data processing, but using the CMOS imaging processing components, the hybrid image sensor allows a CCD image sensor to include image processing on-chip. The on chip image processing is generally faster than off-chip processing and also typically results in smaller camera or other light sensing devices.

DETAILED DESCRIPTION

Figure 1B:
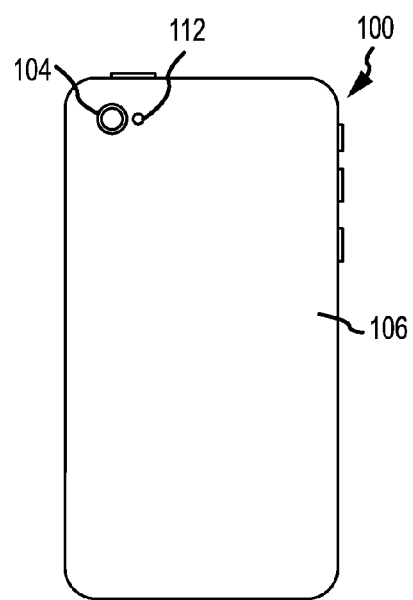
FIG. 1B is a rear perspective view of the electronic device of FIG. 1A.

Turning now to the figures, the image sensor and an illustrative electronic device for incorporating the image sensor will be discussed in more detail. FIG. 1A is a front elevation view of an electronic device 100 including the image sensor. FIG. 1B is a rear elevation view of the electronic device 100. The electronic device 100 may include a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on.

As shown in FIG. 1A, the enclosure 106 may form an outer surface or partial outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
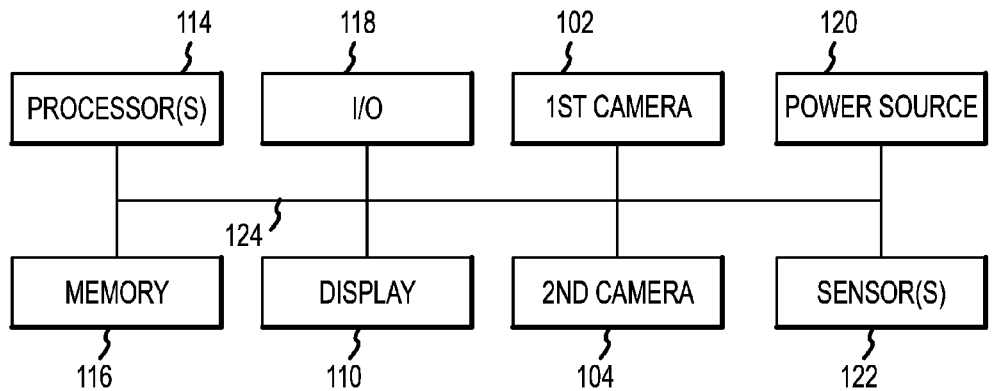
FIG. 2 is a simplified block diagram of the electronic device 100.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element.

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
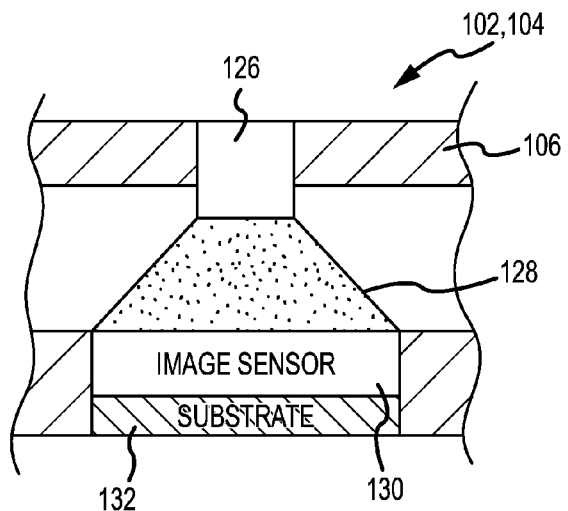
FIG. 3 is a simplified cross-section view of one camera of the electronic device, taken along line 3-3 in FIG. 1A.

With reference again to FIGS. 1A and 1B, the electronic device 100 may also include one or more cameras 102, 104 and optionally a flash 112 or light source for the cameras. FIG. 3 is a simplified cross-section view of one camera 102, taken along line 3-3 in FIG. 1A. Although FIG. 3 illustrates the first camera 102, it should be noted that the second camera 104 may be substantially similar to the first camera 102. In some embodiments one camera may include a global shutter configured image sensor and one camera may include a rolling shutter configured image sensor. In other examples, one camera may have an image sensor with a higher resolution than the image sensor in the other camera. With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view on to a photodiode layer (discussed in more detail below) of the image sensor 130.

The image sensor 130 may be supported beneath the lens 126 by a substrate 132 or other support structure. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 4:
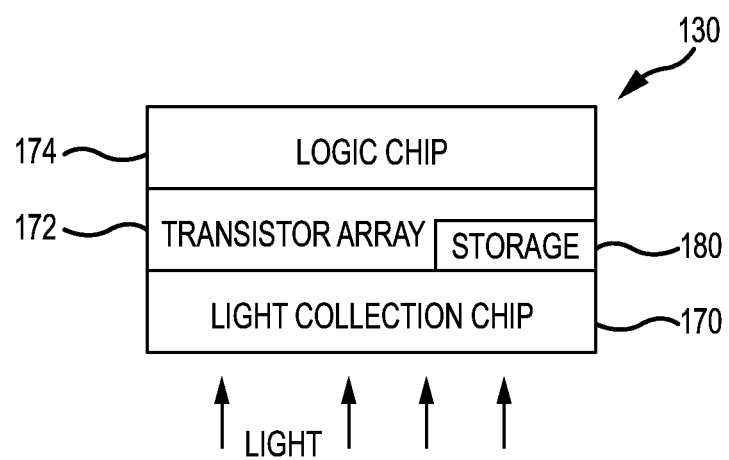
FIG. 4 is a simplified diagram of the image sensor of FIG. 3.

An illustrative architecture for the image sensor 130 will now be discussed in more detail. FIG. 4 is a simplified diagram of the image sensor 130. As shown in FIG. 4, the image sensor 130 may include two or more chips, such as a light collecting chip 170, a transistor array chip 172, and a logic chip 174. Each of the chips may be in communication with one another. The light collecting chip 170 may include a plurality of light collecting elements, such as photodiodes or pixel elements (e.g., CCD light sensitive elements). The light collecting chip 170 collects light as the image sensor 130 is exposed to one or more light sources. The transistor array chip 172 may include a plurality of gates, such as transistors, storage nodes or components, as well as activation or read out circuitry. The transistor array chip 172 is in communication with a logic chip 174 that may be stacked on the transistor array chip 172. The logic chip 174 may include one or more image processing components and/or may provide communication to one or more processing components of the electronic device.

In some embodiments, the transistor array chip 172 may include a two-way charge transfer storage component 180. The storage component 180 will be discussed in more detail below, but may generally have a voltage-dependent potential and may allow charge to be transferred in two directions.

Figure 5C:
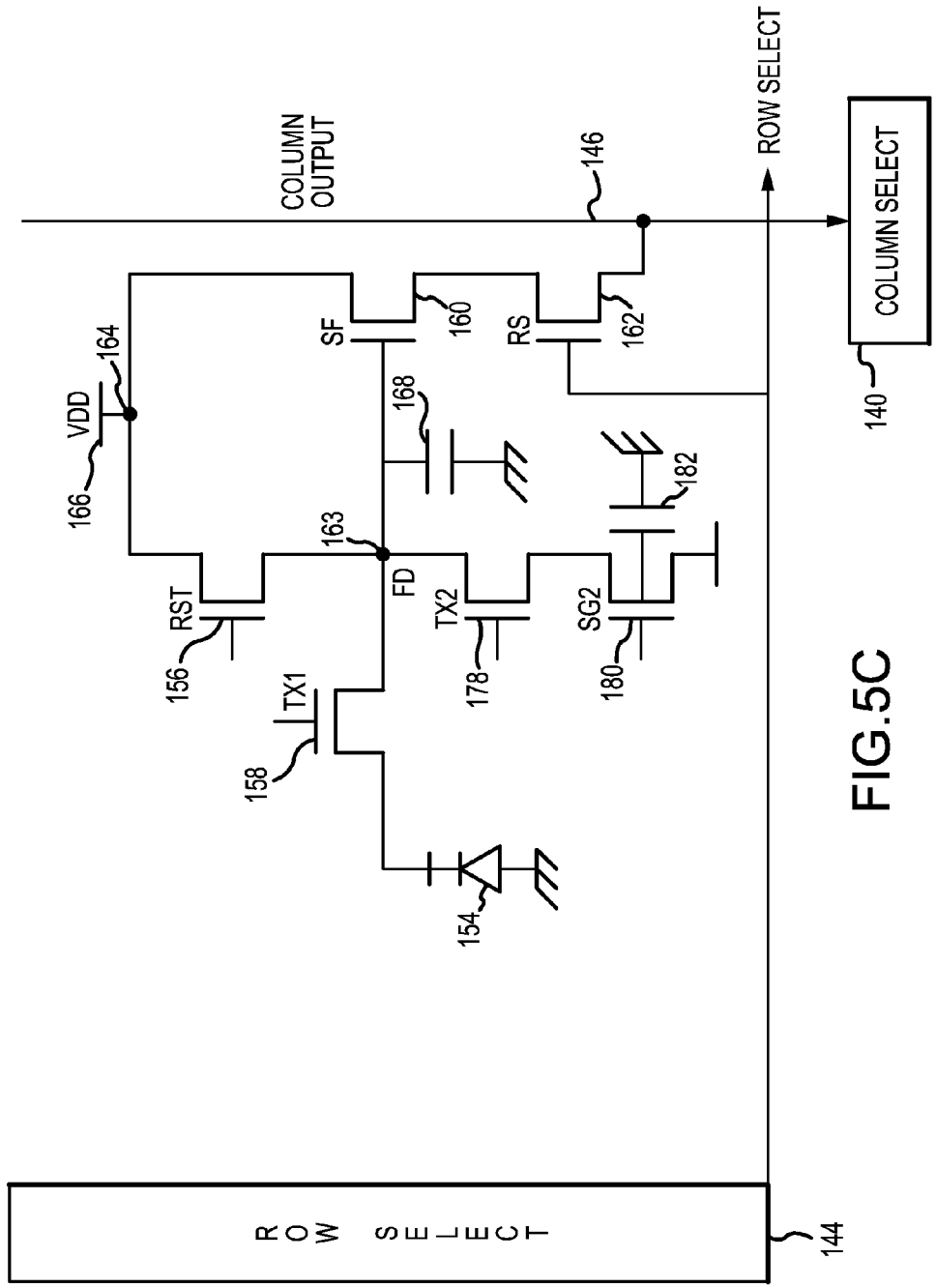
FIG. 5C is a simplified schematic view of the pixel of FIG. 5A including a variable potential storage node component.
Figure 5D:
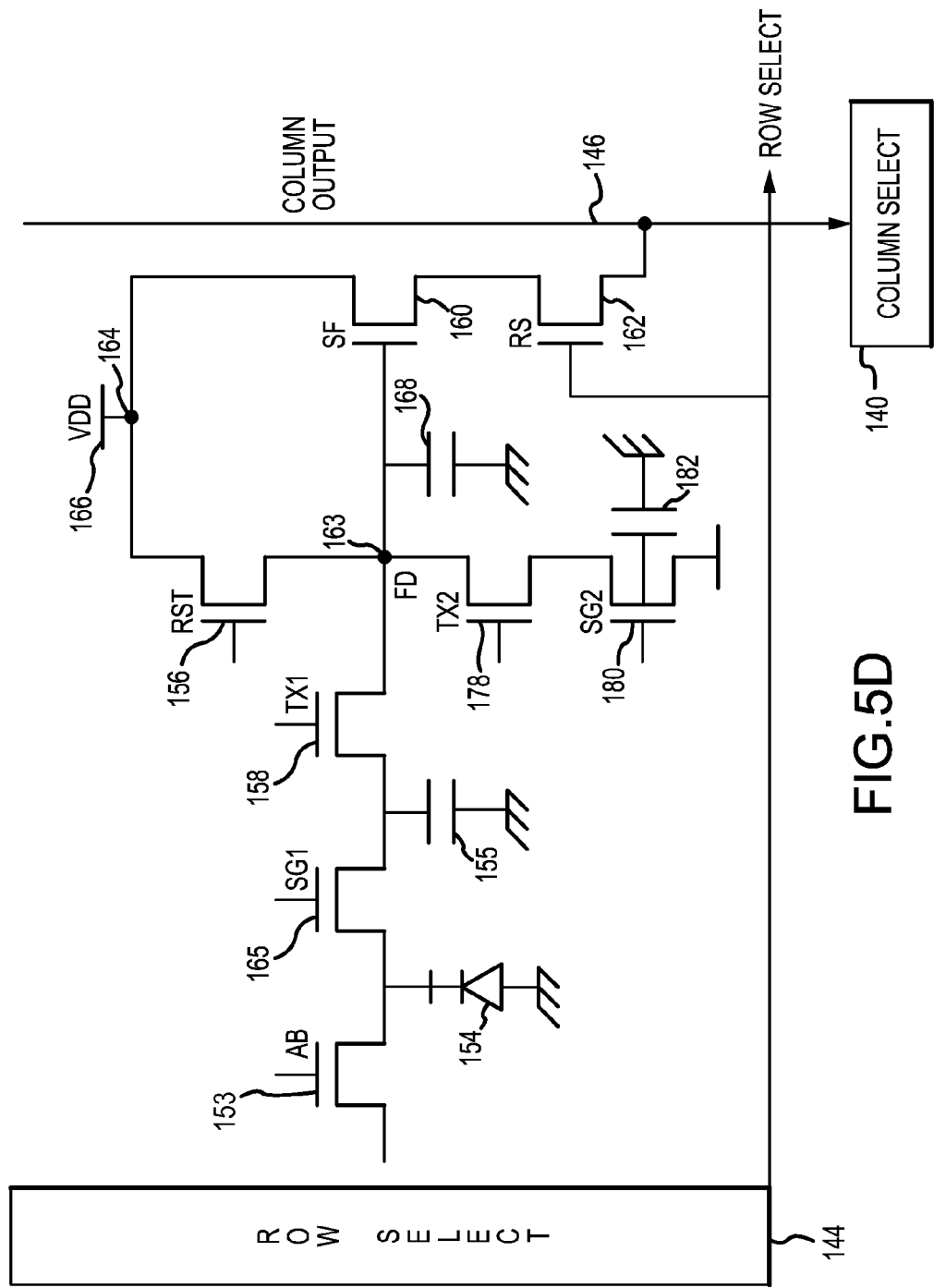
FIG. 5D is a simplified schematic view of a pixel of FIG. 5A in a global shutter configuration and including a variable potential storage node.

Details of the architecture for the image sensor will now be discussed. FIG. 5A is a simplified schematic of an architecture for the image sensor 130. FIG. 5B is an enlarged view of a pixel of the pixel architecture of FIG. 5A. FIG. 5C is a simplified schematic view of the pixel of FIG. 5A including a CCD storage node component in a rolling shutter configuration. FIG. 5D is a simplified schematic view of the pixel of FIG. 5A including a CCD storage component in a global shutter configuration. With reference to FIGS. 5A-5D, the image sensor may include a light collection chip 170, a transistor array chip 172, and a logic chip 174. The image sensor includes a processing component 150 and a pixel architecture 134 or pixel array. This architecture defines one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148. It should be noted that the architecture may be varied between different embodiments described herein and may be tailored to the requirements of the image sensor.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to FIG. 5C and 5D, each pixel 136 may include a transistor array 152 or control circuitry and a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole based photodiode. Additionally, it should be noted that the term photodiode as used herein is meant to encompass substantially any type of photon or light detecting component, such as a photogate or other photon sensitive region. The photodiode 154 is coupled to a first storage gate 165 and a first transfer gate 158, the first transfer gate 158 selectively connects the photodiode 154 to the remaining control circuitry 152 of the pixel 136. Optionally, as shown in the embodiment in FIG. 5D, the photodiode 154 may also be coupled to an anti-blooming gate 153 The anti-blooming gate 153 may be connected to an opposite side of the photodiode from the transfer gate 158 and storage gate 165 and may receive excess charge from the photodiode 154 during integration or during non-integration times.

A first storage node 155 is in communication with the first storage gate 165 and the transfer gate 158. The first storage node 155 may store charge from the photodiode 154 prior to the charge being transfer through the first transfer gate 158 to the floating diffusion node 163.

The first transfer gate 158 is coupled to a reset gate 156 and a source follower (SF) gate 160. A reset gate 162 and the SF gate 160 are coupled to a reference voltage node 164 which connects the two gates to a reference voltage source (Vdd) 166. The row select gate 162 is coupled to a row select line 148 for the pixel 136. A floating diffusion node 163 including a charge storage component 168 or collection terminal may be coupled between the first transfer gate 158 and the reset gate 156 and SF gate 160.

A second transfer gate 178 transfers charge from the floating diffusion 163 to a second storage component 182 controlled by a second storage gate 180. The second storage gate 180 is connected to the floating diffusion node 163 and reset gate 162. The second transfer gate 178 selectively activates transfer between the storage component 182 and the floating diffusion 163. The storage gate 180 and storage component 182 will be discussed in more detail below, but generally may allow two-way charge transfer to enhance data transfer between the pixel 136 and the image processor 142. The second storage component 182 may form a potential well where the electric field within the potential well is determined or controlled by the voltage potential applied to the electrode 194. In other words, the potential may be dynamically modified, as compared to a doped potential or potential determined by an impurity well or dopant level.

It should be noted, that the transistor array may include additional gates other than those shown in FIGS. 5A-5D. For example, an anti-blooming gate may be in communication with the photodiode 154 to drain charge in excess of saturation level from the photodiode. Additionally, the first storage gate 165 may be implemented in embodiments where a global shutter operation is desired. However, in instances where a global shutter is not desired, the first storage gate 165 may be omitted. In other embodiments, the transistor array may include fewer gates than those illustrated in FIG. 5C. For example, the first storage and/or the second transfer gate may be omitted.

Storage Gate Structure

Figure 6A:
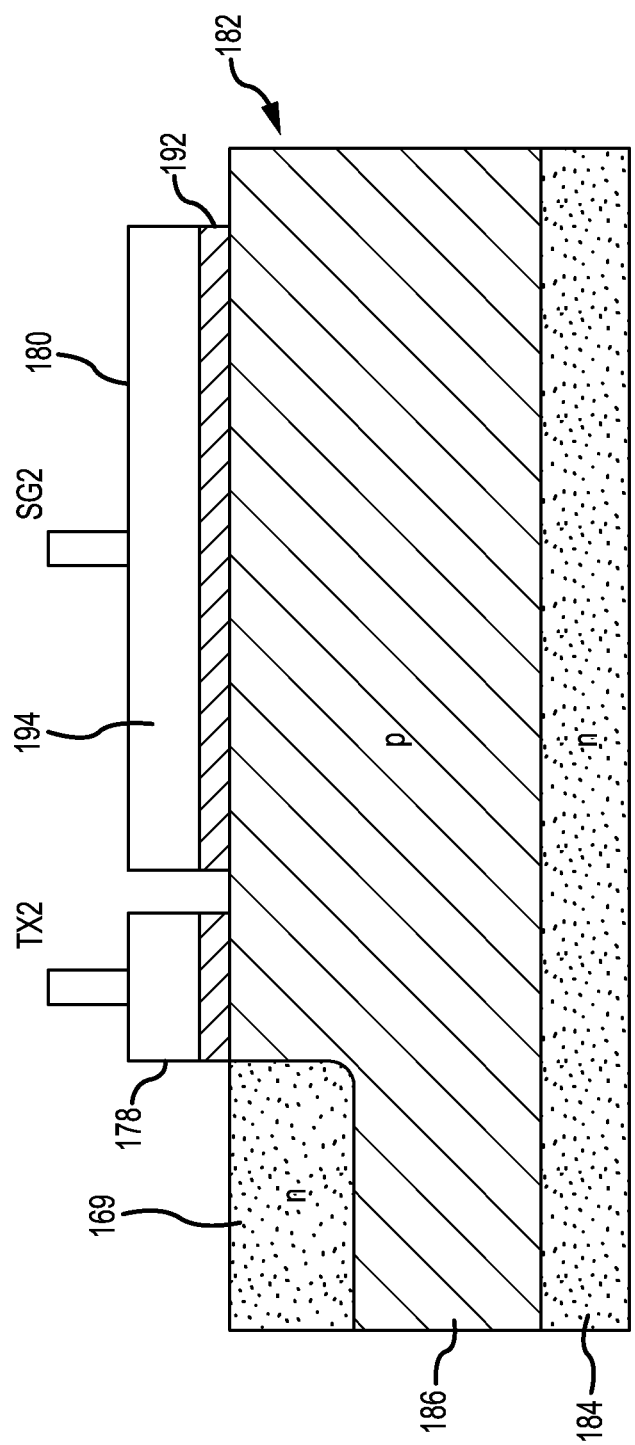
FIG. 6A is a partial cross-section of the image sensor illustrating the second transfer gate and the second storage gate with the second storage gate being in the off state.

As briefly mentioned above, the second storage gate 180 provides charge transfer in two directions. The second storage gate 180 may have a variable potential and thus the potential may be selected based on a desired charge flow direction. FIG. 6A is a partial cross-section of the image sensor illustrating the second transfer gate and the second storage gate with the second storage gate being in the off state. FIG. 6B is a partially cross-section similar to FIG. 6A with the second storage gate being in the on state. With reference first to FIG. 6A, the transistor array chip 172 may include a substrate 184, a doped well 186, and a collection terminal 169. The second transfer gate 178 may be positioned between the collection terminal 169 and the second storage gate 180, the second transfer gate 178 activates carrier transfer between the collection terminal 169 and the second transfer gate 178. It should be noted that in some embodiments, the collection terminal 169 may form the storage component 168 of the floating diffusion or a portion thereof. In these embodiments, the charge held in the first collection terminal 169 may correspond to the charge at the node of the floating diffusion. Additionally, the collection terminal 169 forms a source or drain for the second transfer gate 178.

In some embodiments, the substrate 184 may be silicon and may be n-type doped. The doped well 186 may be doped opposite of the substrate 184 (e.g., p-type doped where the substrate is n-type doped) and the collection terminal 169 may be doped similarly to the substrate (e.g., n-typed doped). The doped well 186 may surround the collection terminal 169 and form the varying potential area of the second storage gate, discussed in more detail below. As briefly mentioned above, the collection terminal 169 may define the source of the second transfer gate 178.

In some embodiments, with reference to FIG. 6A, the collection terminal 169 and the substrate 184 may each be n-type doped silicon and the doped well 186 may be p-type doped. In this manner, the transfer gate 178 may include a triple well structure, where the doped well 186 region is surrounded by oppositely doped regions. In the triple well structure, the doped well 186 "floats" on top of the n-type doped substrate, and in these embodiments, a short circuit will not conduct charge, reducing or eliminating charge leakage.

With continued reference to FIG. 6A, the storage gate 180 may be positioned over an insulated region 192 formed on the doped well 186 and substrate 184. In this embodiment, the doping forming the doped well 186 may extend beneath the storage gate 180 to create a carrier-sensitive region 182 that will be discussed in more detail below. The insulated region 192 may separate the gate 180 or electrode from the doped well 186 region. The insulated region 192 insulates the electrode 194 of the gate 180 from the doped well 186. For example, the insulated region 192 may be silicon dioxide (SiO2) or another type of insulating material. The storage node 182 or carrier sensitive region may be defined by the potential region beneath the storage gate 180 and the potential level of the region may be varied by a voltage applied to the electrode 194, this will be discussed in more detail below. However, the storage node 182 may be positioned to form a drain of the second transfer gate 178, to allow charge carriers to be selectively transferred from the collection terminal 169 or source to the storage node 182.

When the second storage gate 180 is deactivated, the potential of the storage node 182 may be lower than the collection terminal 169. With reference to FIG. 6B, when the storage gate 180 is activated, the electrode 194 applies a voltage to the potential well 186, increasing the potential of the storage node 182 region. When the second storage gate 180 is activated, the storage node 182 has an increased potential as compared to the collection terminal 169. The increased potential allows charge to flow from the collection terminal 169 to the storage node 182 when the transfer gate 178 is activated.

Figure 7:
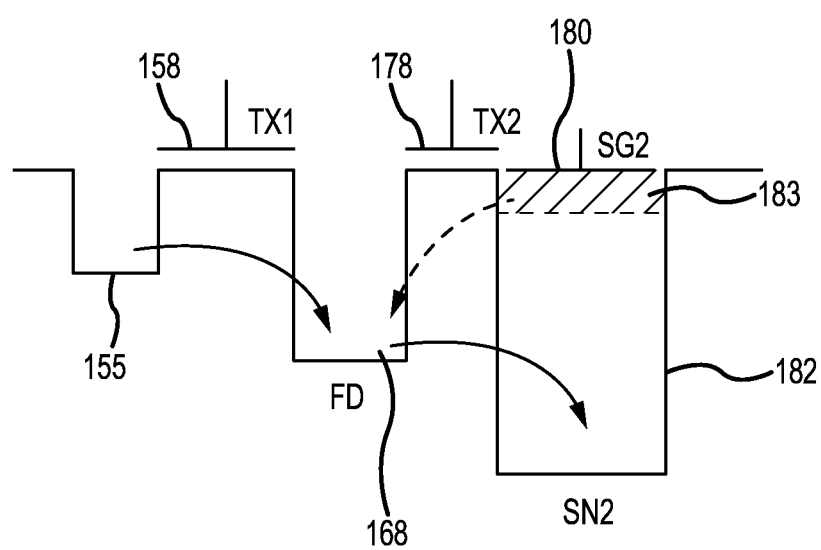
FIG. 7 is a diagram illustrating the potential between the first storage node and the second storage node.

The potential variations for the transistor array will now be discussed in more detail. FIG. 7 is a diagram illustrating the potential between the first storage node 155 and the second storage node 182. With reference to FIG. 7, the potential of the first storage node 155 may be less than the potential of the floating diffusion storage 168, such that when the first transfer gate 158 is activated, charge carriers can transfer from the first storage node 155 into the floating diffusion node. With reference to FIGS. 6B and 7, the activated potential of the second storage node 182 may be higher than the potential of the floating diffusion node 163. Therefore, when the second transfer gate 178 and the second storage gate 180 are activated, the charge carriers may be transferred from the storage component 168 (through the collection terminal 169) of the floating diffusion 163 into the storage node 182 of the storage gate 180.

With reference to FIGS. 6A and 7, when the storage gate 180 is deactivated, the off state potential 183 may be lower than the potential of the storage component 168 for the floating diffusion 163. This may prevent charge from transferring into the storage node 182 from the storage component 168. Additionally, when the second storage gate 180 is deactivated, charge may transfer from the storage node 182 back to the storage component 168 of the floating diffusion 163, as the charge may flow towards the higher potential. For example, to transfer charge from the storage node 182 to the floating diffusion, the second transfer gate 178 may be activated and charge from the low or off state potential 183 of the storage node 182 may transfer into the higher potential of the collection terminal 169 and through a channel formed by the transfer gate 178 into the collection terminal or storage component 168 of the floating diffusion 163. The charge transfer process will be discussed in more detail below, but generally may be used to conduct non-destructive double sampling.

Operation of the Image Sensor

Figure 8:
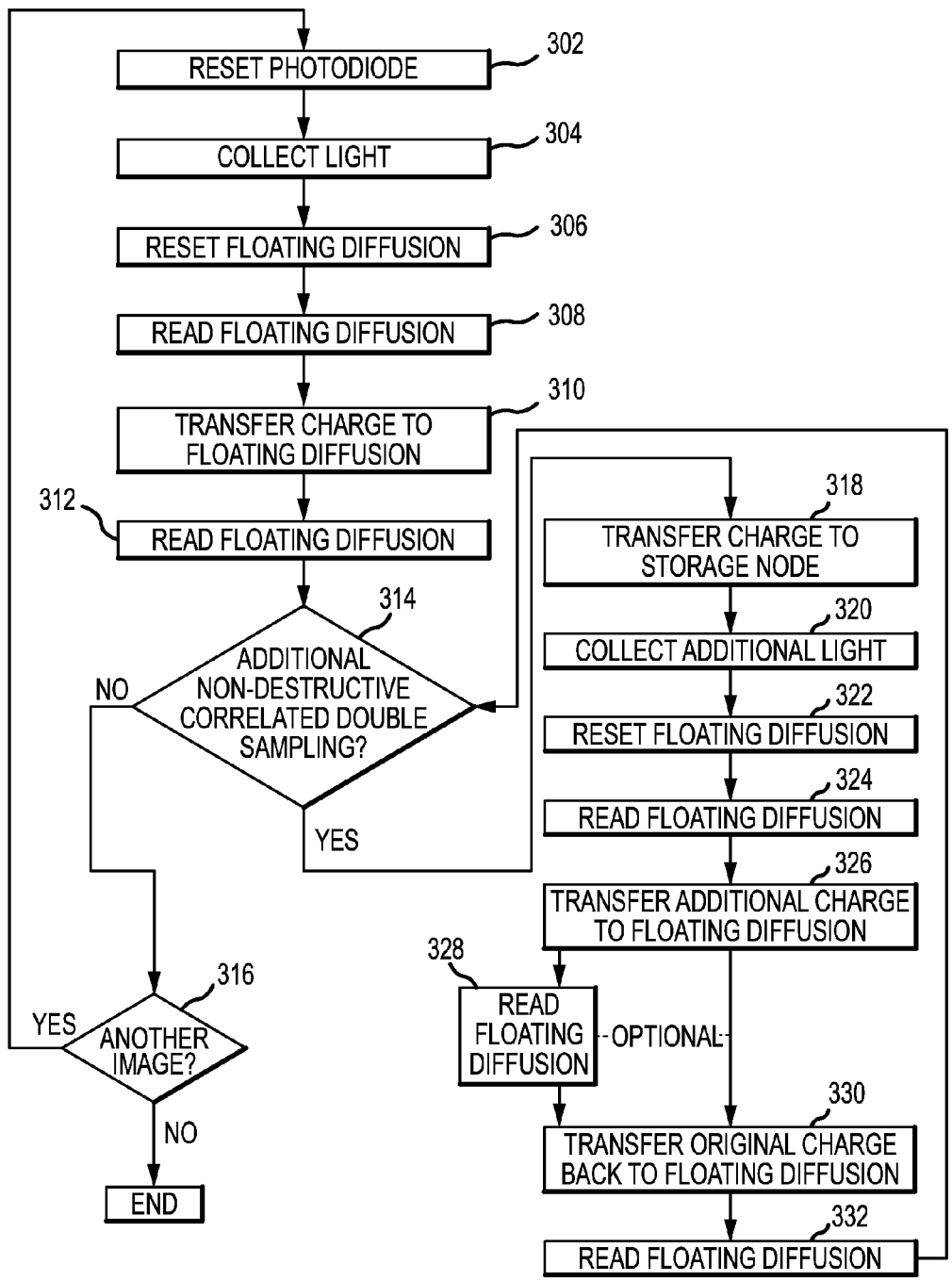
FIG. 8 is a flow chart illustrating a method for capturing one or more images with the image sensor.

Operation of the image sensor will now be discussed. FIG. 8 is a flow chart illustrating a method 300 for capturing one or more images with the image sensor. With reference to FIGS. 1A, 3, 5C and 8, in operation, when one of the cameras 102, 104 is actuated by a user, the method 300 may begin at operation 302. In operation 302, the photodiode 154 may be reset or otherwise prepared to capture an image. For example, the reference voltage 166 is applied to the reset gate 156 and the transfer gate 158. When the transfer gate 158 is open, the charge within the photodiode 154 is drained to deplete the photodiode. In some embodiments, the cameras 102, 104 may not include a shutter over the lens 126, and so the image sensor 130 may be constantly exposed to light. In these embodiments, the photodiode 154 may have to be reset or depleted in operation 302 before a desired image is to be captured. Once the charge from the photodiode 154 has been depleted, the transfer gate 158, and the reset gate 156 may be turned off, isolating the photodiode 154.

Once the photodiode 154 has been reset, the method 300 may proceed to operation 304. In operation 304 the photodiode 154 may then begin integration and collecting light 128 transmitted to the image sensor 130 from the lens 126. As the photodiode 154 receives light, it starts to collect charge (e.g., a depletion region reduces as electrons from the light are received). However, the charge within the photodiode 154 may remain within a well of the photodiode 154 because the transfer gate 158 (connecting the photodiode 154) to the control circuitry 152 and other gates is off.

Once integration is complete and the photodiode 154 has collected light 128 from the lens 126, the method 300 may proceed to operation 306. In operation 306 the floating diffusion 163 may be reset, clearing charge from the floating diffusion storage node 182. For example, the reset gate 156 may be activated with the first transfer gate 158 deactivated, to clear charge from the floating diffusion 163. In some embodiments, the second transfer gate 178 and the storage gate 182 may be activated to clear the charge from the storage component 182 along with resetting the storage component 168 of the floating diffusion.

Once the floating diffusion 163 has been reset, the method 300 may proceed to operation 308. In operation 308, the floating diffusion 163 may be read out. To read out the floating diffusion 163, the reset gate 156 may be turned off and the source follower 160 may be activated. As the source follower 160 is activated, the row select gate 162 allows the signal or charge from the floating diffusion to be transferred to the column output line 146. In some embodiments, operation 308 may be used to allow double sampling. In these embodiments, the "reset" signal of the floating diffusion may be determined, which may allow the processor to analyze the "full" signal of the floating diffusion. The processor may then compare the reset signal and the full signal to determine if noise is present in the full signal. As an example, the reset charge may be subtracted from the full charge value to determine the signal from the photodiode without the noise present in the pixel.

After the floating diffusion 163 has been read, the method 300 may proceed to operation 310. In operation 310, the charge from the photodiode 154 may be transferred to the floating diffusion 163. The first storage gate 165 may be activated, transferring the charge from the photodiode 154 to the first storage node 155. Once the charge is in the first storage node 155, the reset gate 156 may be turned off and the first transfer gate 158 may be turned on. The charge from the first storage node 155 can be transferred to the floating diffusion 163.

Once the charge reaches the floating diffusion 163, the method 300 may proceed to operation 312. In operation 312, the floating diffusion 163 may be read out a second time. Operation 312 may be substantially similar to operation 308; however in operation 312, the floating diffusion may contain the charge from the photodiode. Generally, the charge readout from the floating diffusion 163 during operation 312 may be a larger value than in operation 308 when the reset value of the floating diffusion is read out.

Once the floating diffusion has been read out, the method 300 may proceed to operation 314. In operation 314, the image processor 142 may determine whether additional correlated double sampling is desired. This additional correlated double sampling may be non-destructive, as will be discussed in more detail below. The additional correlated double sampling may be used to determine noise or other factors that may affect the output of the image sensor. However, correlated double sampling may require additional processing power and may introduce additional noise in the data.

In operation 314, if correlated double sampling is not desired, the method 300 may proceed to operation 316. In operation 316, the processor determines whether another image is to be captured. If another image is to be captured, the method 300 may return to operation 302 and the photodiode 154 may be reset. However, if another image is not going to be captured, the method 300 may proceed to an end state and the method may end.

In operation 314, if additional non-destructive correlated double sampling is desired, the method 300 may proceed to operation 318. In operation 318, the charge from the floating diffusion 163 node is transferred from the storage component 168 to the storage component 182 of the storage gate 180. To transfer the charge, the second transfer gate 178 and the second storage gate 180 are activated. When activated, the second storage gate 180 may have an increased potential (as shown in FIG. 6B), which may be higher than the storage component 168 of the floating diffusion 163. Accordingly, with reference to FIG. 7, charge will flow in the direction of increasing potential and flow into the storage component 182 of the storage gate 180.

Once the charge has been transferred to the storage component 182, the method 300 may proceed to operation 320. In operation 320, additional light may be collected. For example, the photodiode 154 may begin integration to collect additional light transmitted through the lens 126. In this example, operation 320 may be substantially similar to operation 304. It should be noted that in some embodiments, operation 320 may be occurring as operations 314 and 318 are occurring, but the first transfer gate 158 and the first storage gate 165 may be deactivated, isolating the photodiode 154 from the other components of the pixel.

After operation 320, the method 300 may proceed to operation 322. In operation 322, the floating diffusion 163 may be reset. For example, as described above with respect to operation 306, the reset gate 156 may be activated with the first transfer gate 158 deactivated, to clear charge from the floating diffusion 163. Once the floating diffusion 163 is reset, the method 300 may proceed to operation 324. In operation 324, the floating diffusion 163 may be read out. Operation 324 may be substantially similar to operation 308. For example, the source follower gate 160 may be activated, allowing charge from the floating diffusion 163 and its storage component 168 to be transferred to the column output.

After operation 324, the method 300 may proceed to operation 326. In operation 326 the additional charge collected by the photodiode 154 during operation 320 may be transferred to the floating diffusion 163. This operation 326 may be substantially the same as operation 310. For example, the first storage gate 165 and the first transfer gate 158 may be activated, allowing charge from the photodiode 154 to flow to the floating diffusion 163.

After operation 326, the method 300 may proceed to optional operation 328. In optional operation 328, the floating diffusion may be read. For example, in instances where an initial reading of the floating diffusion (prior to transferring the original charge stored in the storage component 182 to the floating diffusion) is desired, the floating diffusion may be read out in operation 328. Reading out the floating diffusion 163 may be substantially the same as operations 306, 312, and 322, but in this operation 328 may include the new additional charge collected from the photodiode.

After operation 328, or in embodiments where operation 328 is omitted, the method 300 may proceed to operation 330. In operation 330, the original charge stored in the second storage node 182 may be transferred to the floating diffusion 163 to be combined with the additional charge stored therein. In operation 330, a voltage applied to the electrode 194 (see FIG. 6A), may be reduced, reducing the potential of the storage gate 180. Additionally, the second transfer gate 178 may be activated, creating a channel or pathway between the storage node 182 and the collection terminal 169. Once the potential of the storage gate 180 has been reduce, the charge may flow through from the storage node 182 to the collection terminal 169 to the floating diffusion 163 and storage component 168.

After the stored charge has been transferred back to the floating diffusion 163, the method 300 may proceed to optional operation 332. In operation 332, the floating diffusion 163 may be read out again. Once the floating diffusion has been read out, the method 300 may return to operation 314. In operation 314, the processor may determine whether additional correlated double sampling should be performed.

As described above, the method 300 and the image sensor 130 may provide for non-destructive correlated double sampling. In other words, the values from the photodiode (through the floating diffusion 163) may be sampled multiple times, without losing the charge between samples. The two or more samples may then be compared to determine any noise (such as a difference between the first read out and the second readout) and remove the noise from the signal. The structure of the image sensor 130 including the CCD structure of the storage gate 180 allows a two-way charge transfer to provide for the non-destructive correlated double sampling. In a conventional CMOS image sensor, charge transfer flows in one direction as potential is determined by the doping of the substrate. Therefore, charge is lost during correlated double sampling and multiple readouts of the floating diffusion are then averaged back together. However, with destructive correlated double sampling, noise may be added while averaging the sampled values together.

Additionally, the method 300 and the image sensor may be used to accumulate data from multiple images together. This may allow for multi-frame non-destructive readout, which can reduce motion blur in captured images, while at the same time having low signal to noise ratios (SNR).

Other Examples of the Hybrid Image Sensor

In addition to including one or more CCD or variable potential components within the image sensor to perform correlated double sampling, the image sensor may include one or more CCD components to enhance image processing speed and image quality. For example, using a vertically stacked image sensor as described in related U.S. application Ser. No. 13/756,459 entitled "Vertically Stacked Image Sensor," incorporated by reference herein in its entirety, chip manufacturing processes for each chip (light collection, transistor array, and logic or image processing) may be separated from each other. This may allow each chip within the stacked image sensor to be processed separately. In this example, the conventionally higher cost of CCD chips may be limited to one or two of the chips within the image sensor, reducing the cost of the image sensor as compared to conventional CCD image sensors. As one example, the light collecting chip may include CCD components, whereas the two other chips may include CMOS components. In this example, the light sensitivity of the CCD may be combined with the increased processing speed and cheaper manufacturing of the CMOS components.

As a second example, the light sensitive component may be a CMOS component, and the transistor array chip or middle chip may include CCD components or storage gates and/or ma combination of CCD and CMOS components, with the logic chip including CMOS components. This feature may allow reduced noise through charge transfer using the CCD components, but with the on-chip processing provided by the CMOS components.

Conclusion

The foregoing description has broad application. For example, while examples disclosed herein may focus on a CCD storage component within a CMOS sensor, it should be appreciated that the concepts disclosed herein may equally apply to using CCD elements within other components of a CMOS image sensor. Similarly, although two way charge components and techniques may be discussed with respect to image sensors, the devices and techniques disclosed herein are equally applicable to other types of sensors or applications where correlated double sampling is used. Moreover, although row select gates are described with respect to the pixel architecture, the embodiments disclosed herein may be used in image sensor pixel architectures that do not include row select pixels, as well as other variations of pixel architecture. Accordingly, the discussion of any embodiment is meant only to be exemplary and is not intended to suggest that the scope of the disclosure, including the claims, is limited to these examples.

What is claimed is:

1. A method for performing correlated double sampling for an image sensor, comprising:
    collecting a first charge corresponding to light;
    resetting the first storage component;
    reading the first storage component;
    transferring the first charge to the first storage component;
    reading the first storage component to determine the first charge;
    determining if additional correlated double sampling is to be performed;
    if the additional correlated double sampling is to be performed, increasing a potential of a variable potential second storage component and transferring the first charge from the first storage component to the variable potential second storage component;
    collecting a second charge corresponding to light;
    resetting the first storage component;
    reading the first storage component;
    transferring the second charge to the first storage component;
    decreasing the potential of the variable potential second storage component and transferring the first charge from the variable potential second storage component to the first storage component to combine the first charge with the second charge; and
    reading the first storage component to determine the combined first and second charge.

2. The method of claim 1, wherein the variable potential is determined by a voltage applied to the variable potential second storage component.

3. The method of claim 1, wherein the first storage component has a set potential.

4. The method of claim 3, wherein the set potential is determined by a characteristic of a material forming the first storage component.

5. The method of claim 1, further comprising:
    after reading the first storage component to determine the combined first and second charge, determining if additional correlated double sampling is to be performed;
    if the additional correlated double sampling is to be performed, increasing the potential of the variable potential second storage component and transferring the combined first and second charge to the variable potential second storage component;
    collecting a third charge corresponding to light;
    resetting the first storage component;
    reading the first storage component;
    transferring the third charge to the first storage component;
    decreasing the potential of the variable potential second storage component and transferring the combined first and second charge from the variable potential second storage component to the first storage component to combine the first and second charge with the third charge; and
    reading the first storage component to determine the combined first charge, second charge and the third charge.

6. The method of claim 5, further comprising:
    prior to transferring the combined first and second charge from the variable potential second storage component to the first storage component to combine the first and second charge with the third charge,
    reading the first storage component to determine the third charge.

7. The method of claim 1, wherein reading the first storage component to determine the first charge is performed by a processor.

8. The method of claim 1, further comprising:
prior to transferring the first charge to the first storage component,
- transferring the first charge to an auxiliary storage component; and
- transferring the first charge from the auxiliary storage component to the first storage component after the first storage component has been reset and read.

9. The method of claim 6, further comprising:
prior to transferring the first charge from the variable potential second storage component to the first storage component to combine the first charge with the second charge,
- reading the first storage component to determine the second charge.

* * * * *